(12) United States Patent
Murakami et al.

(10) Patent No.: US 11,899,362 B2
(45) Date of Patent: Feb. 13, 2024

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Yosuke Murakami, Tochigi (JP); Kazuki Nakagawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/067,974

(22) Filed: Dec. 19, 2022

(65) Prior Publication Data
US 2023/0213854 A1    Jul. 6, 2023

(30) Foreign Application Priority Data
Jan. 6, 2022    (JP) ................................ 2022-001285

(51) Int. Cl.
G03F 7/00 (2006.01)
G03F 9/00 (2006.01)
G03F 7/20 (2006.01)

(52) U.S. Cl.
CPC .......... *G03F 7/0002* (2013.01); *G03F 7/2022* (2013.01); *G03F 9/7042* (2013.01)

(58) Field of Classification Search
None
See application file for complete search history.

(56) References Cited

U.S. PATENT DOCUMENTS
2020/0150529 A1* 5/2020 Kobayashi ............ G03F 9/7042

FOREIGN PATENT DOCUMENTS
JP    2016058735 A    4/2016

* cited by examiner

*Primary Examiner* — Joshua D Zimmerman
(74) *Attorney, Agent, or Firm* — ROSSI, KIMMS & McDOWELL LLP

(57) ABSTRACT

An imprint apparatus performs an imprint process including aligning a substrate and a mold in a state in which the mold is in contact with an imprint material on the substrate and curing the imprint material by light irradiation after the aligning. The apparatus includes a first irradiation unit configured to perform first light irradiation of the imprint material on the substrate before bringing the mold into contact with the imprint material on the substrate for the aligning, a second irradiation unit configured to perform second light irradiation of the imprint material on the substrate in the aligning, and a third irradiation unit configured to perform third light irradiation of the imprint material on the substrate in the curing, wherein an exposure amount by the first light irradiation is determined based on an exposure amount by the second light irradiation.

12 Claims, 10 Drawing Sheets

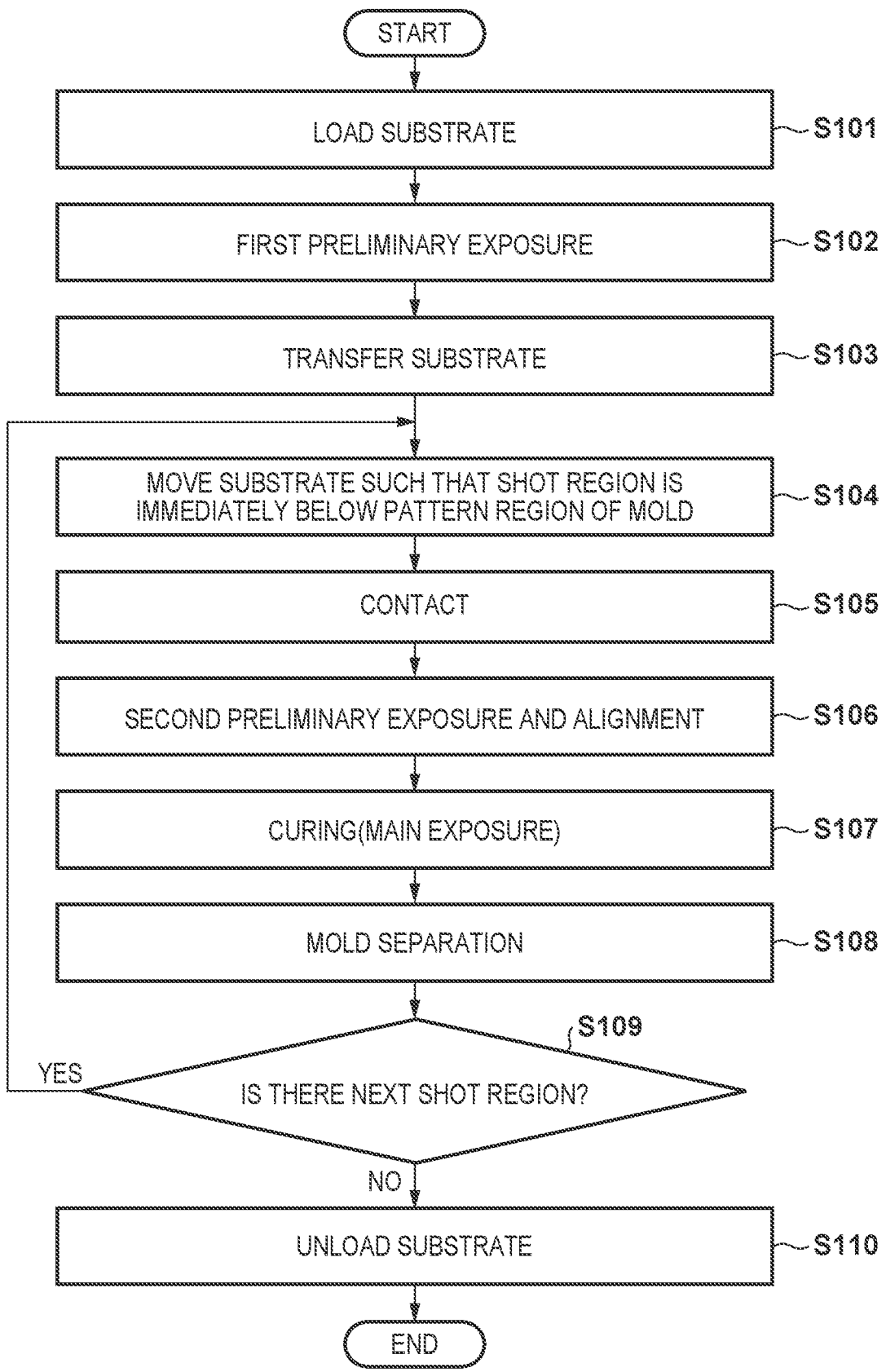

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint apparatus has been put into practice as one of mass production lithography apparatuses for semiconductor devices and the like. The imprint apparatus cures an imprint material supplied onto a substrate in a state in which the imprint material is in contact with a mold and separates the mold from the cured imprint material, thereby forming a pattern on the substrate.

When manufacturing a semiconductor device, a plurality of layers in each of which a pattern such as an electric circuit has been formed are formed on a substrate. Therefore, it is necessary to perform highly accurate alignment upon forming the pattern in each layer so that the electric circuits are successfully connected between the layers.

In the imprint apparatus, alignment is performed in a state in which the imprint material on the substrate and the mold are in contact with each other. It is known that if the viscosity of the imprint material on the substrate is insufficient during the alignment, it is difficult to ensure the desired alignment accuracy. To prevent this, it has been proposed to perform preliminary exposure for irradiating at least a part of the imprint material on the substrate with light in advance to increase the viscosity of the imprint material on the substrate during the alignment (for example, Japanese Patent Laid-Open No. 2016-058735).

The light amount required to increase the viscosity of the imprint material can change in accordance with the material and thickness of the imprint material, and the atmosphere of the imprint space. To increase the light amount for increasing the viscosity, it is necessary to increase the irradiation time or illuminance of light. If the irradiation time of light is increased, the time required for alignment can increase and the throughput can decrease. If the illuminance is increased, there can arise a problem that it is difficult to increase the illuminance due to the upper limit in optical design, the life of the light source is shortened, or the like.

SUMMARY OF THE INVENTION

The present invention provides a technique advantageous in achieving both the alignment accuracy between a mold and a substrate and the throughput.

The present invention in its one aspect provides an imprint apparatus that performs an imprint process including aligning a substrate and a mold in a state in which the mold is in contact with an imprint material on the substrate and curing the imprint material by light irradiation after the aligning, the apparatus comprising a first irradiation unit configured to perform first light irradiation of the imprint material on the substrate before bringing the mold into contact with the imprint material on the substrate for the aligning, a second irradiation unit configured to perform second light irradiation of the imprint material on the substrate in the aligning, and a third irradiation unit configured to perform third light irradiation of the imprint material on the substrate in the curing, wherein an exposure amount by the first light irradiation is determined based on an exposure amount by the second light irradiation.

Further features of the present invention will become apparent from the following description of exemplary embodiments (with reference to the attached drawings).

BRIEF DESCRIPTION OF THE DRAWINGS

FIG. 4 is a flowchart illustrating an imprint method;

DESCRIPTION OF THE EMBODIMENTS

Figure 1:
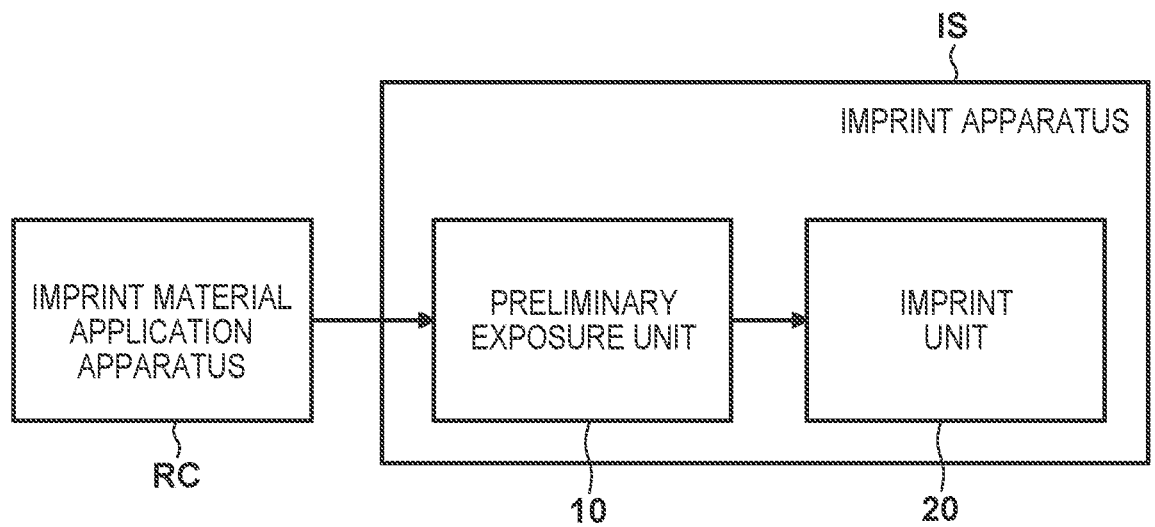
FIG. 1 is a block diagram showing the arrangement of an imprint apparatus.

Embodiments of the present invention will be described below in detail with reference to the accompanying drawings. Note that the following embodiments do not limit the claims of the present invention, and not all combinations of features set forth in the embodiments are essential to the present invention. Features set forth in the embodiments may be combined arbitrarily. The same reference numerals denote the same or similar parts and a repetitive description thereof will be omitted.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. Positioning means controlling the position, posture, or tilt. Alignment can include controlling the position, posture, or tilt of at least one of the substrate and the mold.

First Embodiment

FIG. 1 is a block diagram showing the arrangement of an imprint apparatus IS according to the first embodiment. The imprint apparatus IS is a lithography apparatus used in the manufacturing step of an article such as a semiconductor device. The imprint apparatus IS performs an imprint process for forming a pattern on a substrate. The imprint process can include at least the following steps:
  (a) a contact step of bringing the imprint material supplied onto the substrate and the pattern region of the mold into contact with each other;
  (b) a curing step of curing the imprint material by applying curing energy to the imprint material; and
  (c) a mold separation step of separating the mold from the cured imprint material.

By the imprint process, the concave-convex pattern of the pattern region of the mold is transferred onto the substrate, and a pattern of a cured product is formed on the substrate.

As the imprint material, a curable composition (to be also referred to as a resin in an uncured state) that is cured by receiving curing energy is used. As the curing energy, an electromagnetic wave is used. As the electromagnetic wave, for example, light selected from the wavelength range of 10 nm (inclusive) to 1 mm (inclusive) is used. Examples of the electromagnetic wave are infrared light, a visible light beam, and ultraviolet light. Irradiating the imprint material with light that causes a curing reaction is called exposure.

The curable composition can be a photo-curable composition which is cured by light irradiation. The photo-curable composition contains at least a polymerizable compound and a photopolymerization initiator, and may further contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

Arrows in FIG. 1 indicate the conveyance path of the substrate to be processed. First, in an imprint material application apparatus RC which is an external apparatus of the imprint apparatus IS, an imprint material is supplied onto all of a plurality of shot regions of the substrate in advance. The imprint material is supplied by applying the imprint material. For example, the imprint material is applied by spin-coating the imprint material to the entire surface to be processed of the substrate. Then, the substrate with the imprint material applied thereon is conveyed to a preliminary exposure unit 10 (first irradiation unit) in the imprint apparatus IS. The preliminary exposure unit 10 performs the first preliminary exposure of the imprint material applied on the substrate. In this specification, an operation of irradiating the imprint material with light before bringing the mold into contact with the imprint material is called "preliminary exposure". The substrate having undergone the first preliminary exposure is conveyed to an imprint unit 20 in the imprint apparatus IS. The imprint unit 20 performs an imprint process on the loaded substrate.

Figure 2:
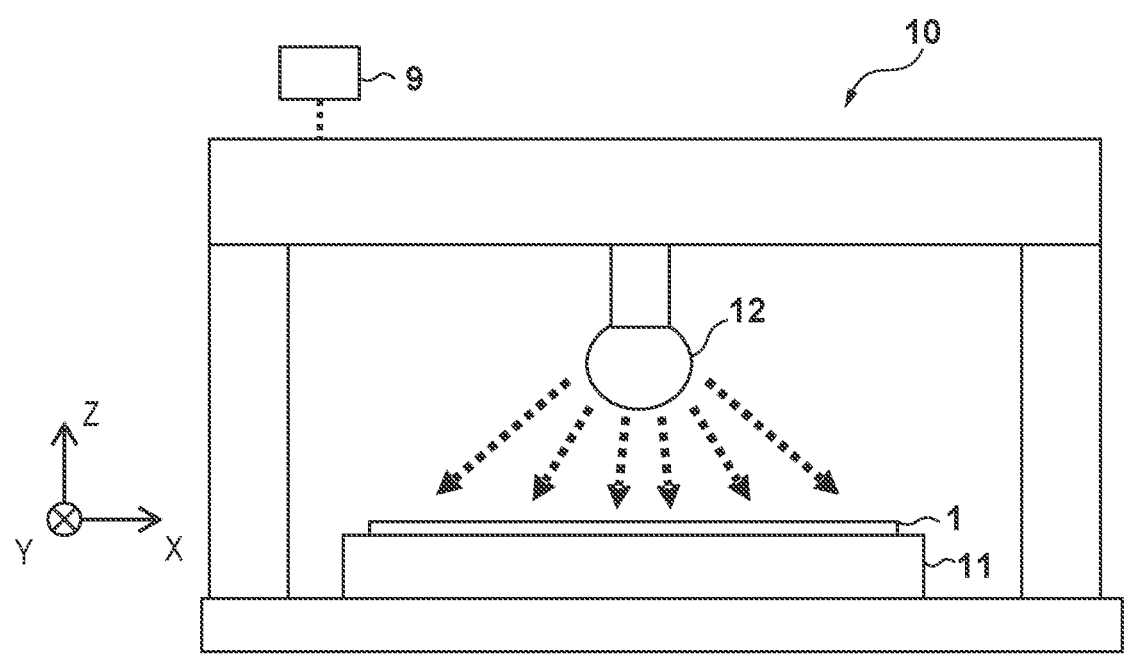
FIG. 2 is a view showing the arrangement of a preliminary exposure unit.

FIG. 2 is a view showing the arrangement of the preliminary exposure unit 10. The preliminary exposure unit 10 includes a substrate holder 11 that holds a substrate 1, and an illumination unit 12 that emits preliminary exposure light. The preliminary exposure unit 10 is connected to a control unit 9. The control unit 9 controls the operation of the preliminary exposure unit 10. The substrate holder 11 includes a holder such as a vacuum chuck or an electrostatic chuck, and holds the substrate 1. The illumination unit 12 includes a light source and an illumination optical system (both are not shown). The illumination unit 12 is configured to be capable of applying light to the entire surface of the substrate 1 held by the substrate holder 11. The illumination unit 12 may apply light by diffusing the light of the light source, or may include a plurality of LED light sources arranged so as to cover the substrate 1. With this arrangement, the preliminary exposure unit 10 can collectively perform preliminary exposure of the imprint material on all of the plurality of shot regions of the substrate. Alternatively, the preliminary exposure unit 10 may be configured to perform the preliminary exposure by scanning illumination light with respect to the plurality of shot regions of the substrate. Scanning exposure can be performed by, for example, driving the substrate holder 11 in the X and Y directions.

The light applied by the illumination unit 12 includes light having a wavelength that causes a curing reaction of the imprint material. The irradiation amount of the light from the illumination unit 12 can be changed by adjusting at least one of the illuminance and irradiation time of the illumination unit 12. The first preliminary exposure is performed for the imprint material applied on the substrate 1 with the exposure amount that does not completely cure the imprint material.

The preliminary exposure unit 10 may be configured to be capable of changing the irradiation amount in the radial direction of the substrate 1. Alternatively, the preliminary exposure unit 10 may be configured to be capable of changing the irradiation amount for each shot region (imprint region) of the substrate 1.

Figure 3:
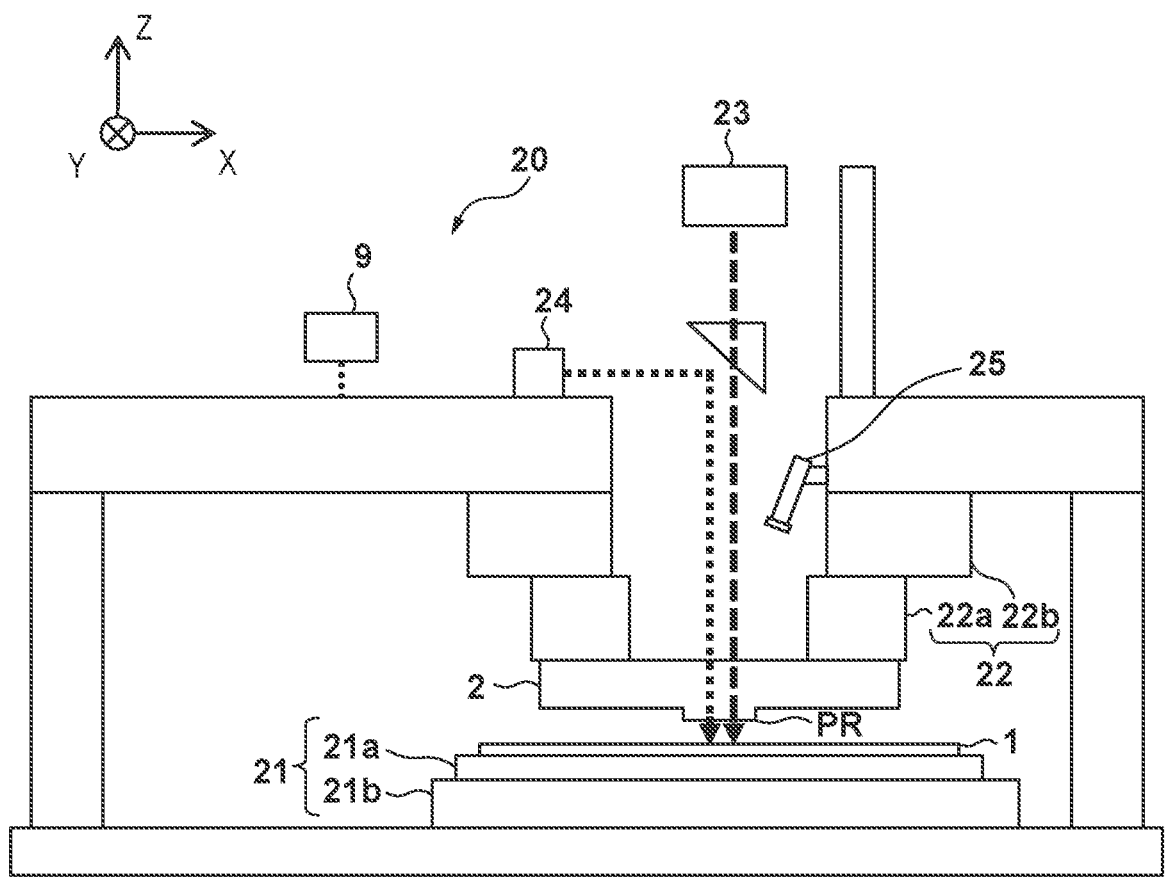
FIG. 3 is a view showing the arrangement of an imprint unit.

FIG. 3 is a view showing the arrangement of the imprint unit 20. The imprint unit 20 can include a substrate positioning unit 21 that holds the substrate 1 and positions the substrate 1, a mold positioning unit 22 that holds a mold 2 and positions the mold 2, a curing unit 23, a viscosity adjusting unit 24, and a measuring unit 25. The imprint unit 20 is connected to the control unit 9. The control unit 9 controls the operation of the imprint unit 20.

The mold 2 has, for example, a rectangular outer shape. The mold 2 can be made of a material such as quartz that can transmit ultraviolet light. The mold 2 includes a pattern region PR on the surface facing the substrate 1. In the pattern region PR, a concave-convex pattern to be transferred to the imprint material on the substrate 1 is formed in a three-dimensional shape. The pattern region PR is also called a mesa, and formed on a convex portion of several ten μm to several hundred μm so the region of the mold 2 other than the pattern region PR does not come into contact with the substrate 1.

The substrate 1 is made of, for example, a semiconductor (such as silicon or a compound semiconductor), glass, a ceramic, a metal, a resin, or the like. The substrate 1 can include one or a plurality of layers on the base material. In this case, the base material is made of, for example, a semiconductor, glass, a ceramic, a metal, a resin, or the like. The substrate 1 can be provided with an adhesion layer, as needed, to improve the adhesion between the imprint material and the substrate 1. The plurality of shot regions (imprint regions) are formed on the substrate 1.

The mold positioning unit 22 can include a mold holder 22a and a mold driving mechanism 22b. The mold holder 22a holds the mold 2 by, for example, a vacuum suction force or an electrostatic force. The mold driving mechanism 22b is a driving system for changing the distance between the mold 2 and the substrate 1. The mold driving mechanism 22b drives (moves) the mold 2 in the Z direction by driving the mold holder 22a. The mold driving mechanism 22b includes, for example, an actuator such as a linear motor or an air cylinder, and drives the mold holder 22a holding the mold 2. The mold driving mechanism 22b is configured to drive the mold 2 (mold holder 22a) in a plurality of axes (for example, three axes including the Z-, θX-, and θY-axes). In order to implement highly accurate positioning of the mold 2, the mold driving mechanism 22b may include a plurality of driving systems such as a coarse driving system and a fine driving system. The mold driving mechanism 22b may have a function of driving the mold 2 not only in the Z direction but also in the X direction, the Y direction, and the θZ direction, or a function of correcting the tilt of the mold 2.

The substrate positioning unit 21 can include a substrate holder 21a that holds the substrate 1, and a substrate driving mechanism 21b. The substrate holder 21a holds the substrate 1 by, for example, a vacuum suction force or an electrostatic force. The substrate driving mechanism 21b drives (moves) the substrate 1 in the X direction and the Y direction by driving the substrate holder 21a. The substrate driving mechanism 21b includes an actuator such as a linear motor or an air cylinder, and drives the substrate holder 21a holding the substrate 1. The substrate driving mechanism 21b can be configured to drive the substrate 1 (substrate holder 21a) in a plurality of axes (for example, three axes including the X-, Y-, and θZ-axes, and preferably six axes including the X-, Y-, Z-, θX-, θY-, and θZ-axes). The substrate driving mechanism 21b may include a plurality of driving systems such as a coarse driving system and a fine driving system. The substrate driving mechanism 21b may have a function of driving the substrate 1 in the Z direction and the θZ direction, or a function of correcting the tilt of the substrate 1.

The measuring unit 25 detects alignment marks provided on the substrate 1 and the mold 2 to measure the relative displacement between the substrate 1 and the mold 2 in the X direction and Y direction. The measuring unit 25 is formed from a light source for measurement used in alignment mark detection, a camera, an optical system, and the like. In this specification, when simply describing the "relative displacement" hereinafter, it indicates the relative displacement (positional shift) between the substrate 1 and the mold 2 in the X direction and Y direction.

The mold positioning unit 22 and the substrate positioning unit 21 form a mechanism that drives the mold 2 or the substrate 1 to adjust the relative position, relative posture, and relative tilt between the mold 2 and the substrate 1 in the X-Y plane, thereby deciding the relative position between the mold 2 and the substrate 1. The mold positioning unit 22 and the substrate positioning unit 21 can be used to perform alignment to reduce error components concerning the relative shift and rotation between the pattern region PR of the mold 2 and the shot region of the substrate 1. The viscosity of the imprint material is adjusted using the viscosity adjusting unit 24 during an alignment operation. The details will be described later.

The mold positioning unit 22 and the substrate positioning unit 21 further form a mechanism that drives the mold 2 or the substrate 1 to adjust the relative position, relative posture, and relative tilt between the mold 2 and the substrate 1 in the Z direction by changing the positions of the substrate 1 and mold 2 in the Z direction. Adjusting the Z-direction relative position by the mold positioning unit 22 and/or the substrate positioning unit 21 includes driving for bringing the imprint material on the substrate 1 and the mold 2 into contact with each other and separating the mold 2 from the cured imprint material (the pattern of the cured product).

In a state in which the imprint material on the shot region of the substrate 1 and the pattern region PR of the mold 2 are in contact with each other, the viscosity adjusting unit 24 (second irradiation unit) applies, via the mold 2, light including a wavelength that causes a curing reaction of the imprint material (second preliminary exposure). With this operation, the viscosity of the imprint material is increased, and the vibration component of the relative displacement is decreased. In this embodiment, the viscosity adjusting unit 24 includes, for example, a light source that emits light (exposure light such as ultraviolet light) that cures the imprint material. Alternatively, the viscosity adjusting unit 24 may include an optical element for adjusting light emitted from the light source to suitable light for the imprint process. The viscosity adjusting unit 24 can adjust the illuminance, irradiation distribution, and the like using, for example, a Digital Micromirror Device (DMD). The DMD includes a plurality of mirror elements, and can adjust the irradiation region by individually controlling the surface directions of the plurality of mirror elements.

The curing unit 23 (third irradiation unit) supplies or applies energy (for example, light such as ultraviolet light) for curing the imprint material, thereby curing the imprint material. More specifically, the curing unit 23 emits light via the mold 2 in a state in which the imprint material on the shot region of the substrate 1 and the pattern region PR of the mold 2 are in contact with each other (main exposure). With this operation, a pattern formed of a cured product of the imprint material is formed. In this embodiment, the curing unit 23 includes, for example, a light source that emits light (exposure light such as ultraviolet light) that cures the imprint material. Alternatively, the curing unit 23 may include an optical element for adjusting light emitted from the light source to suitable light for the imprint process.

The control unit 9 controls the preliminary exposure unit 10 and the imprint unit 20, thereby controlling the entire imprint apparatus IS (operation thereof). Further, the control unit 9 controls the respective units of the imprint unit 20 to perform the imprint process. The control unit 9 can be formed from, for example, a Programmable Logic Device (PLD) such as a Field Programmable Gate Array (FPGA), an Application Specific Integrated Circuit (ASIC), a general-purpose computer installed with a program, or a combination of all or some of these components.

FIG. 4 is a flowchart illustrating the imprint method of the imprint apparatus IS according to the first embodiment. FIG. 4 illustrates a process of forming a pattern in each of the plurality of shot regions of the substrate 1. Note that a description of loading of the mold 2 to the mold holder 22a and unloading of the mold 2 from the mold holder 22a will be omitted. Processing described in FIG. 4 are controlled by the control unit 9.

In step S101 (substrate loading step), the control unit 9 controls a substrate conveyance apparatus (not shown) to load the substrate 1, on which the imprint material has been applied in the imprint material application apparatus RC, to the substrate holder 11 of the preliminary exposure unit 10.

Figure 11A:
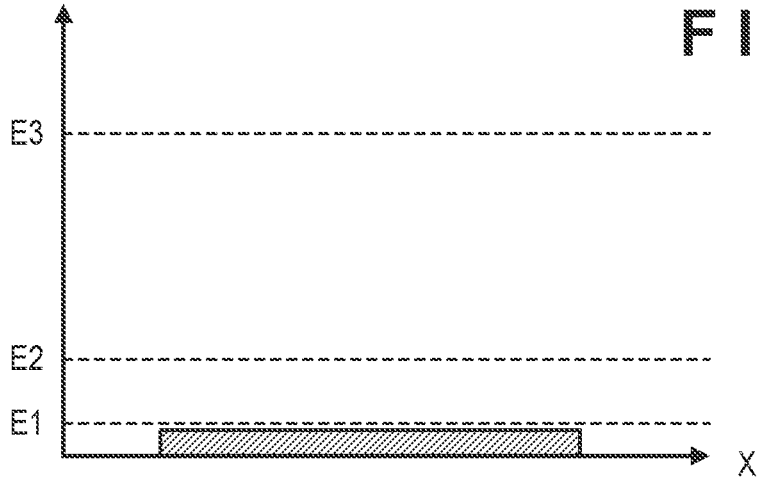
FIGS. 11A to 11C are graphs showing examples of the integral exposure amounts of the first preliminary exposure, second preliminary exposure, and main exposure, respectively.

In step S102 (first preliminary exposure step), the control unit 9 controls the preliminary exposure unit 10 to perform the first preliminary exposure (first light irradiation) of the imprint material on the substrate 1. FIG. 11A shows an example of the exposure amount by the first preliminary exposure. The abscissa represents the X coordinate of the shot region, and the ordinate represents the exposure amount. A first curing threshold value E1 is a predetermined threshold value of the exposure amount by the first preliminary exposure. The first preliminary exposure is performed so as not to exceed the first curing threshold value E1. The first curing threshold value E1 (that is, the exposure amount by the first light irradiation) is determined based on the exposure amount of the second preliminary exposure (the exposure amount by the second light irradiation) performed by the viscosity adjusting unit 24 in an alignment step (S106). Adjustment of the exposure amount by the first preliminary exposure will be described later.

In step S103 (substrate transfer step), the control unit 9 controls the substrate conveyance apparatus to transfer the substrate 1 from the preliminary exposure unit 10 to the substrate holder 21a of the imprint unit 20.

In step S104 (moving step), the control unit 9 drives the substrate positioning unit 3 so as to locate the shot region of the substrate 1 at the position facing the pattern region PR of the mold 2.

In step S105 (contact step), the control unit 9 drives the mold positioning unit 4 to bring the pattern region PR of the mold 2 into contact with the imprint material on the substrate 1.

Figure 11B:
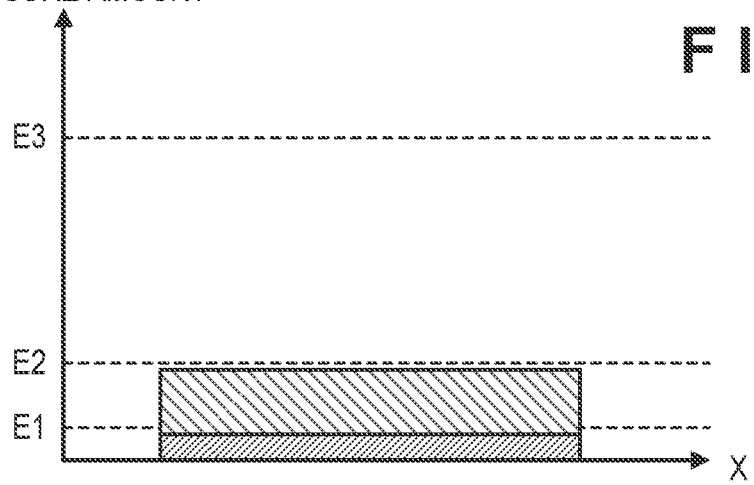

Step S106 (alignment step) includes a second preliminary exposure step. In step S106, the control unit 9 controls the viscosity adjusting unit 24 and performs the second preliminary exposure (second light irradiation) of the imprint material on the substrate, thereby adjusting the viscosity of the imprint material. FIG. 11B shows an example of the integral exposure amount by the second preliminary exposure. A second curing threshold value E2 is a threshold value of the integral exposure amount of the first preliminary exposure and second preliminary exposure, which is determined in advance to effectively increase the viscosity of the imprint material. The second preliminary exposure is performed so as not to exceed the second curing threshold value E2. Thereafter, the control unit 9 controls the mold positioning unit 22 and the substrate positioning unit 21 to perform alignment between the substrate 1 and the mold 2.

Figure 11C:
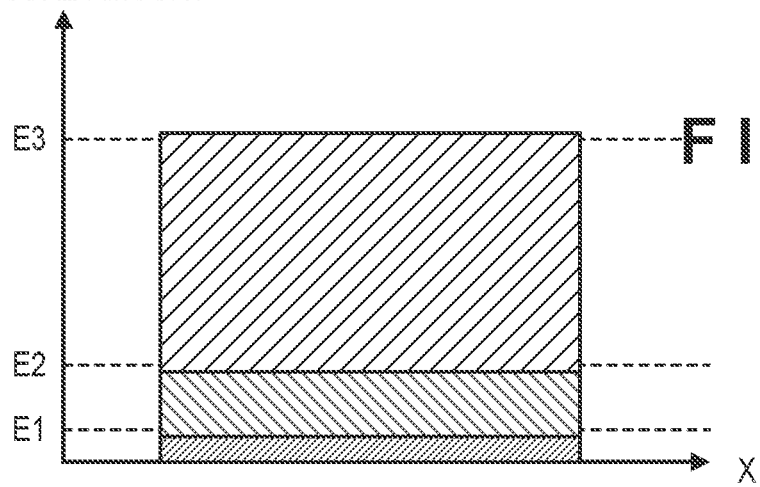

In step S107 (curing step), the control unit 9 controls the curing unit 23 to perform the main exposure (third light irradiation) of the imprint material, thereby curing the imprint material. FIG. 11C shows an example of the integral exposure amount by the main exposure. A third curing threshold value E3 is a threshold value of the integral exposure amount of the first preliminary exposure, second preliminary exposure, and main exposure, which is determined in advance to achieve a state in which the imprint material is sufficiently cured and separatable from the mold. The main exposure is stopped when the integral exposure amount exceeds the third curing threshold value E3.

In step S108 (mold separation step), the control unit 9 drives the mold positioning unit 4 to separate the mold 2 from the substrate 1.

In step S109, the control unit 9 determines whether there is a next shot region. If there is the next shot region, the process returns to step S104, and the imprint process is performed on the next shot region. If there is no next shot region, the process advances to step S110.

In step S110 (substrate unloading step), the control unit 9 controls the substrate conveyance apparatus to unload the substrate 1 from the substrate holder 3a, and terminates the operation performed by the imprint method.

Figure 5A:
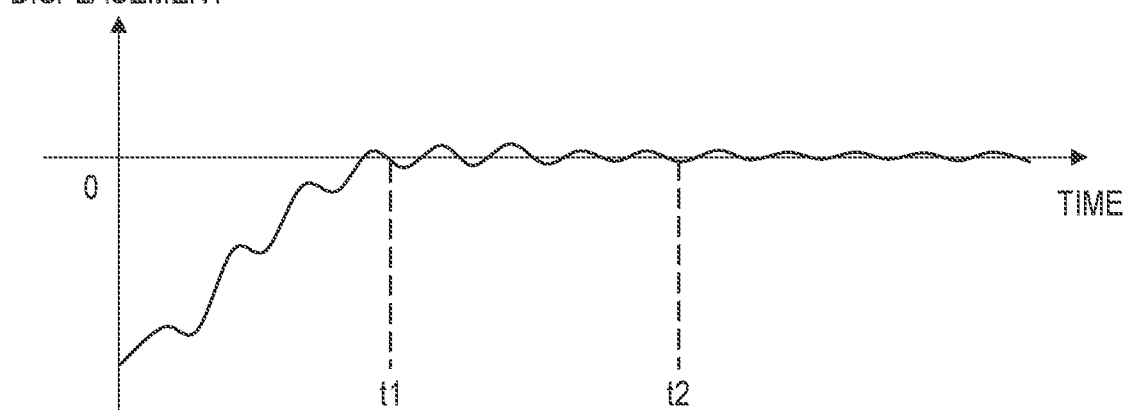
FIGS. 5A to 5C are graphs showing the relative displacement between a mold and a substrate and the illuminance.
Figure 5B:
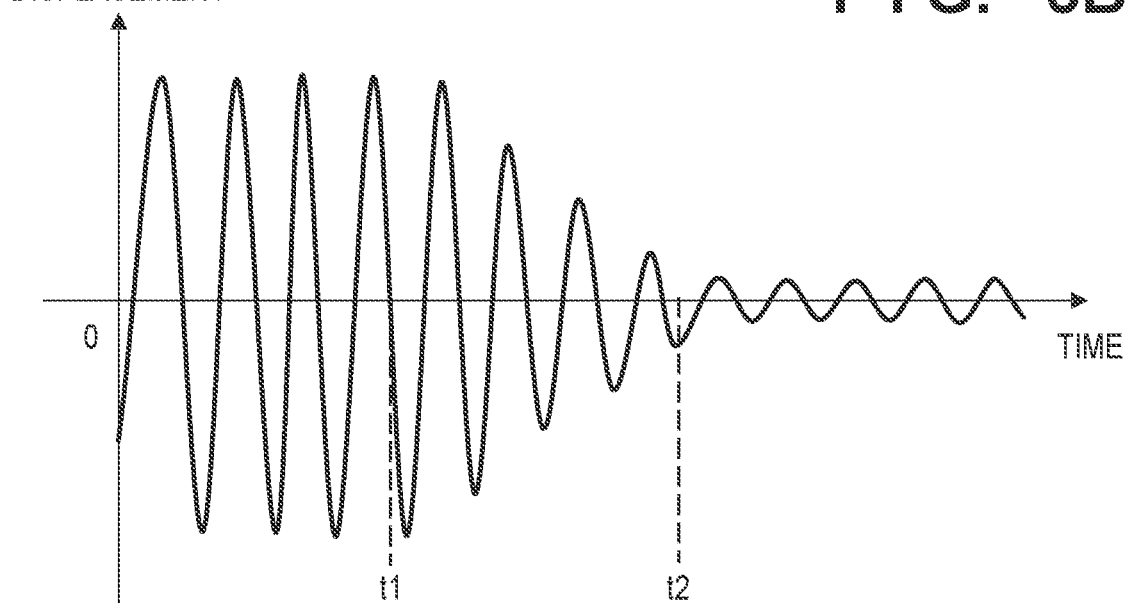
Figure 5C:
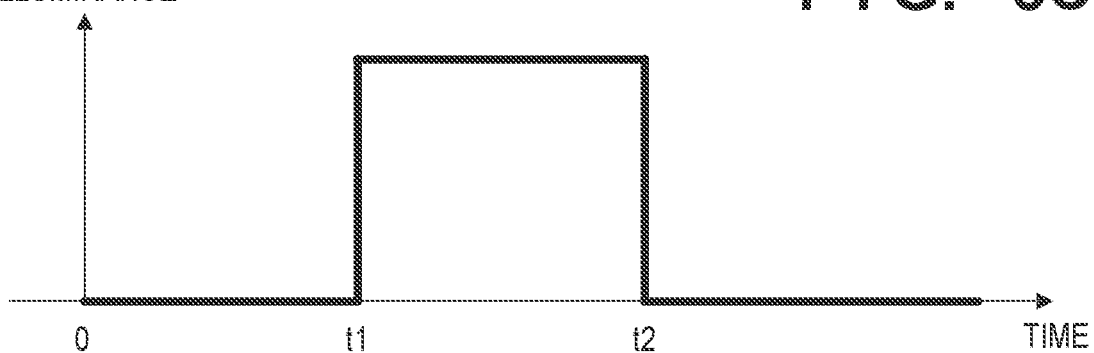

With reference to FIGS. 5A to 5C, the relative displacement in the alignment step in step S106 will be described. In the alignment step, it is an object to make the relative displacement close to zero. Here, for the sake of descriptive convenience, the relative displacement in the X direction alone will be described. FIG. 5A shows a graph in which the abscissa represents the time and the ordinate represents the relative displacement. FIG. 5B shows a graph displaying the enlarged vibration component of the relative displacement shown in FIG. 5A. FIG. 5C shows a graph in which the abscissa represents the time and the ordinate represents the illuminance by the viscosity adjusting unit 24.

Time 0 is the start time of step S106. Time t1 is the start time of viscosity adjustment (second light irradiation) by the viscosity adjusting unit 24, and time t2 is the end time thereof. When the substrate positioning unit 21 is controlled so as to decrease the relative displacement in a period from time t0 to time t1, the relative displacement is decreased as shown in FIG. 5A. However, the vibration component remains at time t1 as shown in FIG. 5B. The vibration component remains because it is impossible to completely follow the vibration due to variations in alignment measurement, measurement frequency, responsiveness of the substrate positioning unit 21, and the like. Therefore, in the alignment step, the control unit 9 controls the viscosity adjusting unit 24 to irradiate the imprint material on the substrate with light so as to increase the viscosity of the imprint material, thereby increasing the viscosity resistance between the substrate 1 and the mold 2 and decreasing the relative displacement.

As shown in FIG. 5C, when the viscosity adjusting unit 24 applies light during a period from time t1 to time t2 (viscosity adjustment), the amplitude of the relative displacement is decreased from time t1 to time t2 as shown in FIG. 5B. In this embodiment, the first preliminary exposure is performed in step S102. Accordingly, the exposure amount of the second preliminary exposure (the irradiation amount by the second light irradiation) performed by the viscosity adjusting unit 24 in step S106 (alignment step) can be reduced. The irradiation amount can be reduced by shortening the irradiation time or decreasing the illuminance while maintaining the irradiation time. If the first preliminary exposure in step S102 is not performed, the viscosity of the imprint material is not immediately increased by applying light by the viscosity adjusting unit 24. This is because, for example, air is dissolved in the imprint material on the substrate 1, and oxygen inhibition delays the curing reaction. Alternatively, in general, an SOC film or the like is formed on the substrate 1 for a subsequent etching step, and the imprint material is applied thereon. The SOC film contains oxygen in the air and the like, and oxygen inhibition delays the curing reaction. On the other hand, according to this embodiment, light irradiation is performed in advance in the first preliminary exposure, so that the viscosity of the imprint material can be rapidly increased. As the effect of shortening the light irradiation time for the second preliminary exposure by the viscosity adjusting unit 24, the time required for the alignment in the imprint unit 20 can be shortened. While the imprint unit 20 performs the imprint process, the preliminary exposure unit 10 can perform the first preliminary exposure for the substrate to be processed next. That is, in the imprint apparatus IS, the imprint process for the substrate and the first preliminary exposure of the imprint material on another substrate can be performed in parallel. This can shorten the alignment time, resulting in an improvement in throughput of the imprint apparatus IS. As the effect of decreasing the illuminance while maintaining the irradiation time, for example, performance deterioration of the light source of the viscosity adjusting unit 24 can be suppressed (the life of the light source increases).

Figure 6:
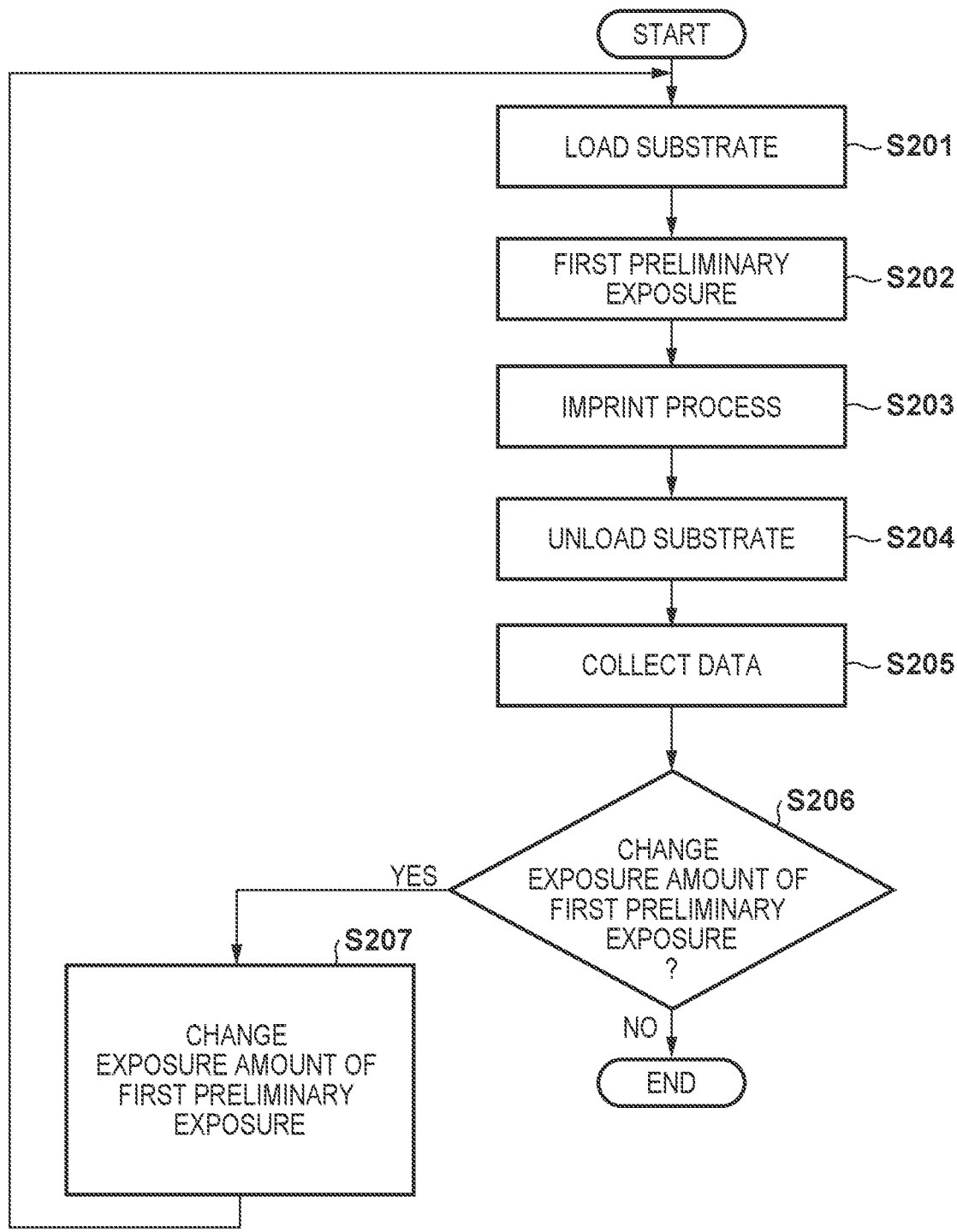
FIG. 6 is a flowchart illustrating an imprint process including a step of adjusting the preliminary exposure amount.

With reference to FIG. 6, a method of adjusting the exposure amount of the first preliminary exposure by the preliminary exposure unit 10 will be described. FIG. 6 shows a flowchart of an imprint process including a step of adjusting the exposure amount of the first preliminary exposure.

In step S201 (substrate loading step), the control unit 9 controls the substrate conveyance apparatus to load the substrate 1, on which the imprint material has been applied in the imprint material application apparatus RC, to the substrate holder 11 of the preliminary exposure unit 10.

In step S202 (first preliminary exposure step), the control unit 9 controls the preliminary exposure unit 10 to perform the first preliminary exposure of the imprint material on the substrate 1. Here, a distribution may be given to the exposure amount of the first preliminary exposure in the surface of the substrate 1. For example, the imprint material on the substrate 1 has a variation in film thickness in the radial direction since it is applied by a method such as spin coating in the imprint material application apparatus RC. In addition, warpage and the like may occur in the radial direction due to the lower layer process of the substrate 1 or the like. Due to them, the optimal exposure amount of the first preliminary exposure may change between the central portion of the substrate 1 and, particularly, the outer peripheral portion of the substrate 1. In consideration of them, the exposure amount of the first preliminary exposure (the irradiation amount by the first light irradiation) is adjusted in the radial direction of the substrate 1. More specifically, the film thickness of the spin-coated imprint material is measured in advance by a measurement device, or calculated by simulation or the like. From the result, the control unit 9 obtains the relationship between the position in the radial direction of the substrate 1 and the film thickness, and decides the illuminance in accordance with the film thickness. For example, the illuminance proportional to the film thickness is set. With this, the control unit 9 can control the exposure amount of the first preliminary exposure for each shot region in accordance with the film thickness distribution of the imprint material on the substrate 1. This increases the process margin with respect to the uneven film thickness, resulting in an advantage in productivity.

In step S203 (imprint step), the control unit 9 performs the imprint process for each of the plurality of shot regions of the substrate 1. Step S203 corresponds to steps S103 to S109 of FIG. 4.

In step S204 (substrate unloading step), the control unit 9 controls the substrate conveyance apparatus to unload the substrate 1 from the substrate holder 3a.

In step S205 (data collection step), the control unit 9 collects data concerning the alignment step in the imprint step of step S203. The data to be collected is the data of the evaluation value concerning the alignment step. The evaluation value can be, for example, the magnitude (amplitude or the like) of the vibration component of the relative displacement. Alternatively, the evaluation value may be the measurement value of the viscosity resistance force of the imprint material upon moving the substrate 1 by the substrate positioning unit 22 in the alignment step. In general, since the substrate 1 includes the plurality of shot regions, the number of the evaluation values to be obtained is equal to the number of the shot regions.

In step S206, based on the data collected in step S205, the control unit 9 determines whether to change the exposure amount of the first preliminary exposure. The determination is made based on whether the viscosity of the imprint material is increased before viscosity adjustment of the imprint material in the alignment step and the viscosity resistance force exceeds a reference value upon driving the substrate positioning unit 4 in the alignment step. If the viscosity resistance force does not exceed the reference value, the margin of the viscosity resistance force with respect to the reference value may be determined.

If the viscosity resistance force is excessively large, the mold 2 may be deformed during alignment driving, and the overlay accuracy may be decreased. Therefore, the reference value of the viscosity resistance force can be set in accordance with the required overlay accuracy. In an example, the reference value is set such that the viscosity resistance force becomes equal to or smaller than 1 N. When the determination is made based on the magnitude (amplitude) of the vibration component, the degree of decrease in the amplitude magnitude may be calculated and compared with the amplitude magnitude which is obtained when no first preliminary exposure is performed. For example, if the amplitude is equal to or smaller than a reference which is set to be half the amplitude obtained when no first preliminary exposure is performed, it is determined that the viscosity increases. If it is determined that it is unnecessary to change the exposure amount by the first preliminary exposure, the process is terminated. If the exposure amount by the first preliminary exposure is to be changed, the process advances to step S207.

As has been described above, in step S205, the evaluation value is obtained for each shot region. The statistic value such as the average value, maximum value, minimum value, or the like of the evaluation values can be used for the determination. In an example, the control unit 9 may perform the determination for each shot region, and adjust the exposure amount of the first preliminary exposure (the irradiation amount by the first light irradiation) by the preliminary exposure unit 10 for each shot region.

In step S207 (adjustment step), based on the data collected in step S205, the control unit 9 adjusts the exposure amount of the first preliminary exposure performed next in step S202. For example, if it is determined in step S206 that the viscosity resistance force has a margin with respect to the reference value (for example, the viscosity resistance force is smaller than the reference value by a predetermined amount or more), the exposure amount of the first preliminary exposure is increased. If it is determined in step S206 that the viscosity resistance force is larger than the reference value, the exposure amount of the first preliminary exposure is decreased.

In this manner, in the imprint apparatus IS, the first preliminary exposure is performed by the preliminary exposure unit 10, and the viscosity adjustment is performed thereafter. With this, the imprint material can be cured in a state in which the relative displacement between the substrate 1 and the mold 2 is decreased. Thus, both the alignment accuracy and the high throughput can be achieved.

Second Embodiment

An imprint apparatus IS according to the second embodiment will be described below. Matters not mentioned in the second embodiment follow the first embodiment. In the first embodiment, the substrate 1 is loaded in the imprint apparatus IS in a state in which the imprint material has been applied to the substrate 1 by the imprint material application apparatus RC. On the other hand, in the second embodiment, an imprint material is supplied onto a substrate 1 in the imprint apparatus IS.

Figure 7:
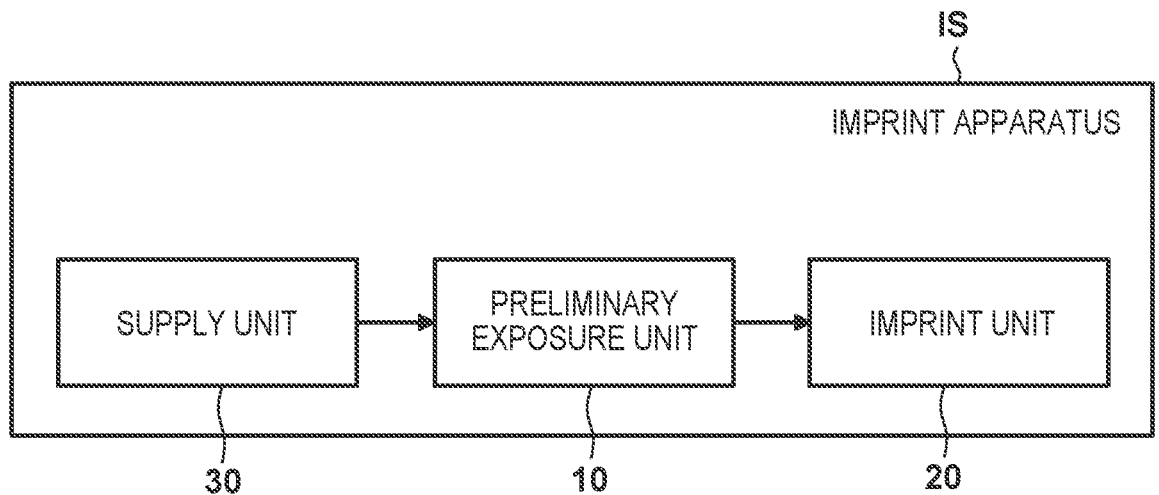
FIG. 7 is a block diagram showing the arrangement of another imprint apparatus.

FIG. 7 is a block diagram showing the arrangement of the imprint apparatus IS according to the second embodiment. Arrows in FIG. 7 indicate the conveyance path of the substrate to be processed. The imprint apparatus IS includes an imprint material supply unit 30. The imprint material supply unit 30 supplies the imprint material onto the loaded substrate. The substrate with the imprint material supplied thereon by the imprint material supply unit 30 is conveyed to a preliminary exposure unit 40 (first irradiation unit). The preliminary exposure unit 40 performs the first preliminary exposure of the imprint material supplied onto the substrate. The substrate having undergone the first preliminary exposure is conveyed to an imprint unit 20. The imprint unit 20 performs an imprint process on the loaded substrate.

Figure 8:
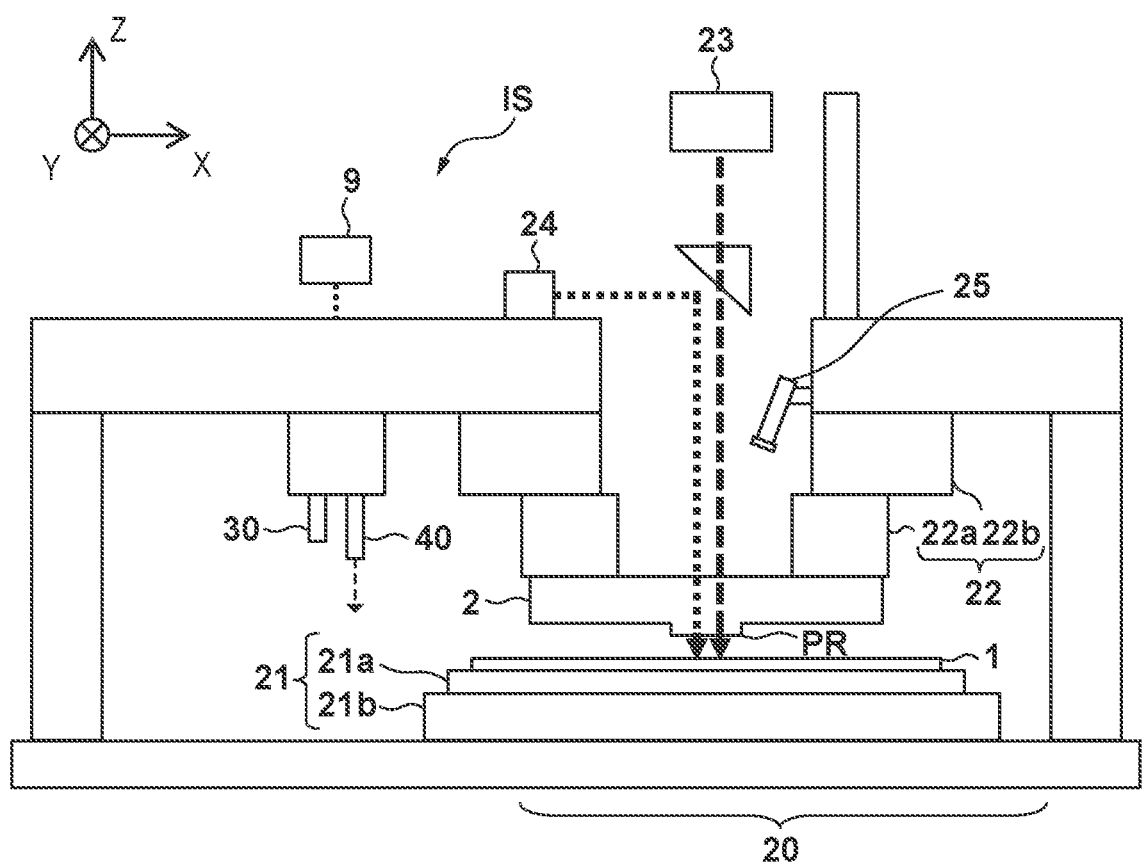
FIG. 8 is a view showing the arrangement of the other imprint apparatus.

FIG. 8 is a view showing the arrangement of the imprint apparatus IS. The imprint apparatus IS can include the imprint material supply unit 30, the preliminary exposure unit 40, the imprint unit 20, and a control unit 9. The imprint unit 20 can include a substrate positioning unit 21 that holds the substrate 1 and positions the substrate 1, a mold positioning unit 22 that holds a mold 2 and positions the mold 2, a curing unit 23, a viscosity adjusting unit 24, and a measuring unit 25. These components of the imprint unit 20 are similar to those in the first embodiment, and a description thereof will be omitted.

The imprint material supply unit 30 drops the imprint material onto the substrate 1 by, for example, an inkjet method. When supplying the imprint material, the substrate 1 is arranged immediately below the imprint material supply unit 30 by the substrate positioning unit 21. The imprint material is supplied continuously to a plurality of shot regions, and the imprint process is then performed for each shot region of the plurality of shot regions with the imprint material supplied thereto.

The preliminary exposure unit 40 includes a light source and illumination optical system for performing the first preliminary exposure. The preliminary exposure unit 40 is configured to be capable of applying light onto the substrate 1. The light applied by the preliminary exposure unit 40 includes light having a wavelength that causes a curing reaction of the imprint material. The light irradiation amount in the first preliminary exposure can be changed by adjusting the illuminance and irradiation time of the light source of the preliminary exposure unit 40. The first preliminary exposure is performed for the imprint material applied on the substrate 1 with the exposure amount that does not completely cure the imprint material.

Figure 9:
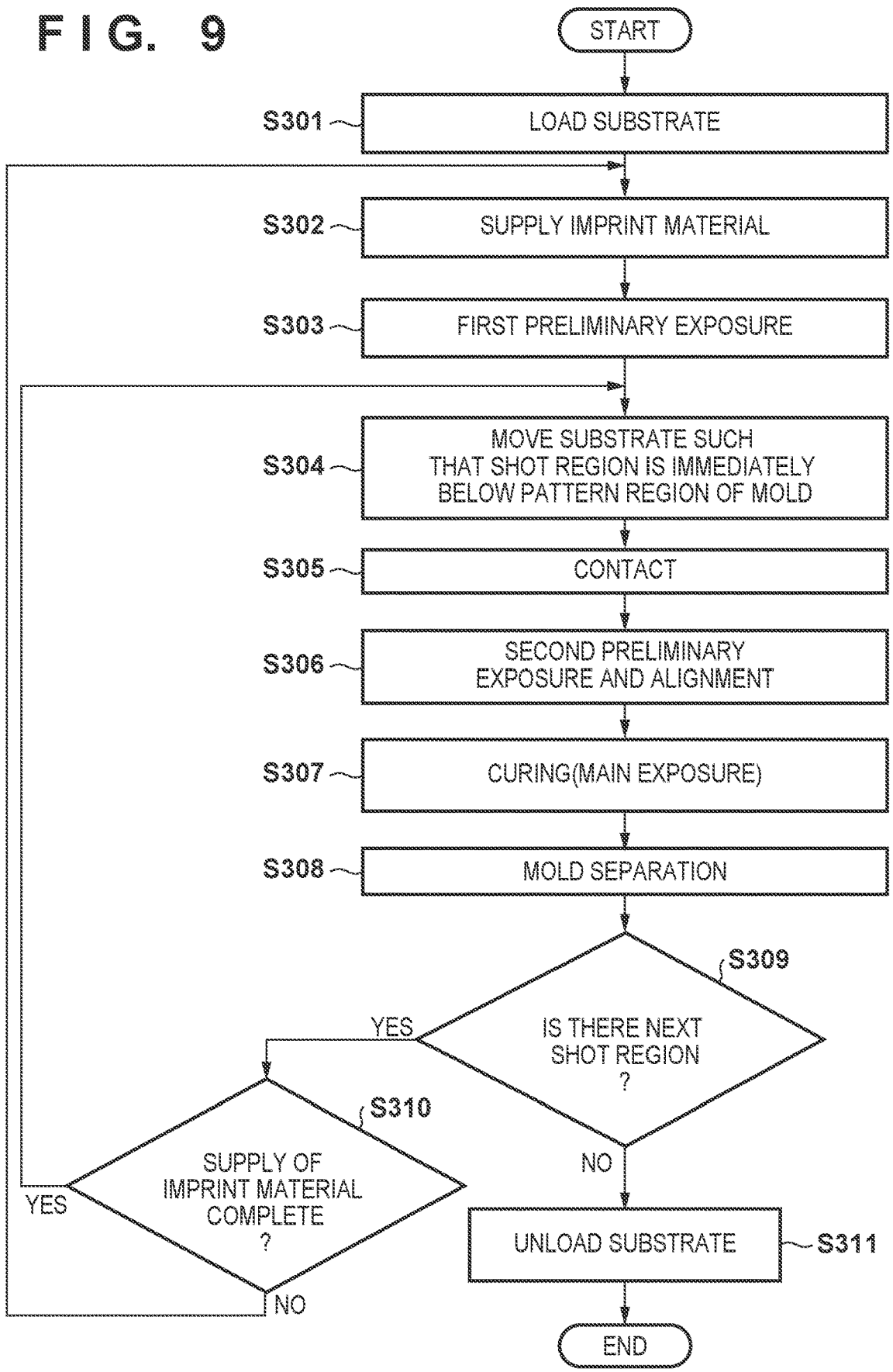
FIG. 9 is a flowchart illustrating another imprint method.

FIG. 9 is a flowchart illustrating the imprint method of the imprint apparatus IS according to the second embodiment. FIG. 9 illustrates a process of forming a pattern in each of the plurality of shot regions of the substrate 1. Note that a description of loading of the mold 2 to a mold holder 22a and unloading of the mold 2 from the mold holder 22a will be omitted. Processing described in FIG. 9 are controlled by the control unit 9.

In step S301 (substrate loading step), the control unit 9 controls a substrate conveyance apparatus (not shown) to load the substrate 1 to a substrate holder 21a.

Figure 10A:
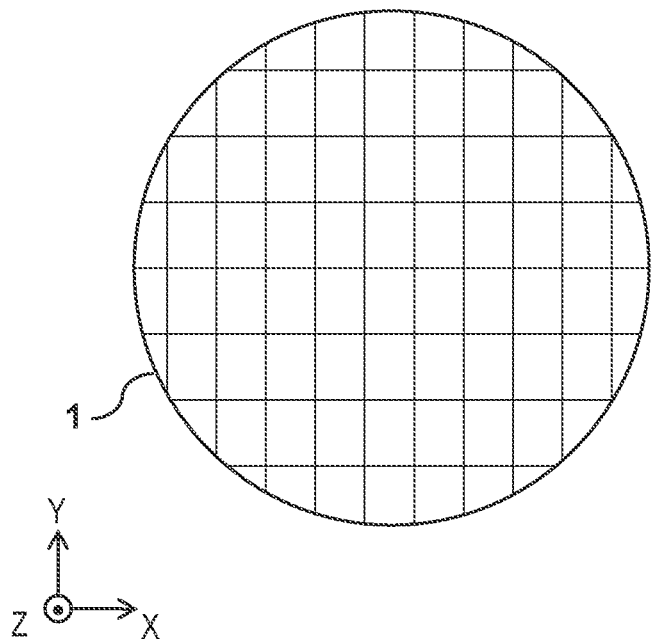
FIGS. 10A and 10B are views showing a division example of an imprint material supply region.
Figure 10B:
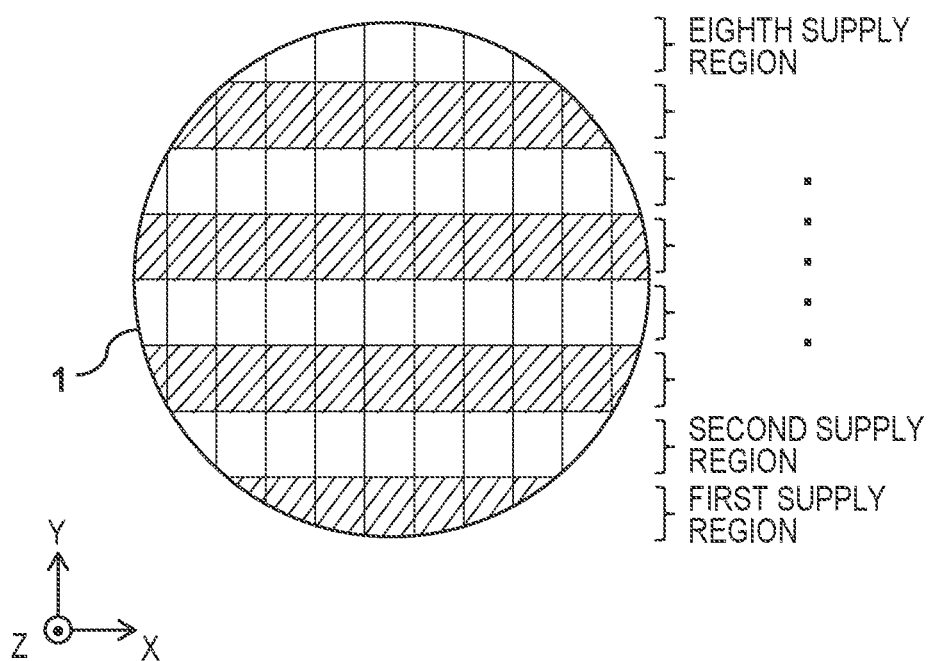

In step S302 (supply step), the control unit 9 controls the substrate positioning unit 21 and the imprint material supply unit 30 to supply (drop) the imprint material onto a predetermined sub-region of the substrate 1. The predetermined sub-region includes, for example, the shot regions arranged in a row in the X direction. FIGS. 10A and 10B show an example of the sub-region of the substrate 1. FIG. 10A shows the layout of the plurality of shot regions of the substrate 1. Typically, as shown in FIG. 10A, with respect to the circular substrate 1, each shot region has a rectangular shape except the shot region located in the outer peripheral portion. Here, the shot regions arranged in a row in the X direction are defined as one sub-region. FIG. 10B shows an example in which the plurality of shot regions are divided into eight sub-regions (first to eighth supply regions) each arranged in a row in the X direction. In step S302, the imprint material is supplied onto one selected sub-region.

In step S303 (first preliminary exposure step), the control unit 9 controls the preliminary exposure unit 40 to perform the first preliminary exposure (first light irradiation) of the imprint material on the sub-region of the substrate 1. At this time, a masking member may be arranged so as to prevent the exposure light from leaking to other sub-regions. Alternatively, instead of using the masking member, the preliminary exposure unit 40 may include a laser light source and a DMD to obtain sharp light-shielding characteristics in the edge of the sub-region.

Steps S304 to S308 are similar to steps S104 to S108 in the first embodiment, and a description thereof will be omitted.

In step S309, the control unit 9 determines whether there is a next shot region. If there is the next shot region, the process advances to step S310. If there is no next shot region, the process advances to step S311.

In step S310, it is determined whether supply of the imprint material onto the next shot region is already complete. If supply of the imprint material onto the next shot region is complete, the process returns to step S304, and the imprint process on the next shot region is performed. If the imprint material is not supplied onto the next shot region yet, the process returns to step S302, and the imprint material is supplied to the sub-region including the next shot region.

In step S311 (substrate unloading step), the control unit 9 controls the substrate conveyance apparatus to unload the substrate 1 from the substrate holder 21a, and terminates the operation performed by the imprint method.

In this manner, the imprint apparatus IS according to the second embodiment repeats supply of the imprint material, the preliminary exposure, and the imprint process, thereby processing the substrate 1. Collectively performing the preliminary exposure on the plurality of shot regions in the sub-region with the imprint material supplied thereon can achieve a shorter processing time as compared to adjusting the viscosity in each shot region after the contact step. Further, unlike the viscosity adjusting unit 24 located above and far from the substrate in the Z-axis direction of the imprint unit 20, the preliminary exposure unit 40 can be arranged near the substrate 1. Therefore, this is advantageous in optical design, and it is possible to increase the irradiation range of the light source of the preliminary exposure unit 40 or increase the output thereof. Accordingly, using both the preliminary exposure unit 40 and the viscosity adjusting unit 24 can shorten the time required for viscosity adjustment of the imprint material as compared to adjusting the viscosity of the imprint material by the viscosity adjusting unit 24 alone. Thus, the throughput of the imprint apparatus IS is improved.

Embodiment of Method of Manufacturing Article

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

A method of manufacturing an article will be described next. As shown step SA of FIG. 12, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 12:
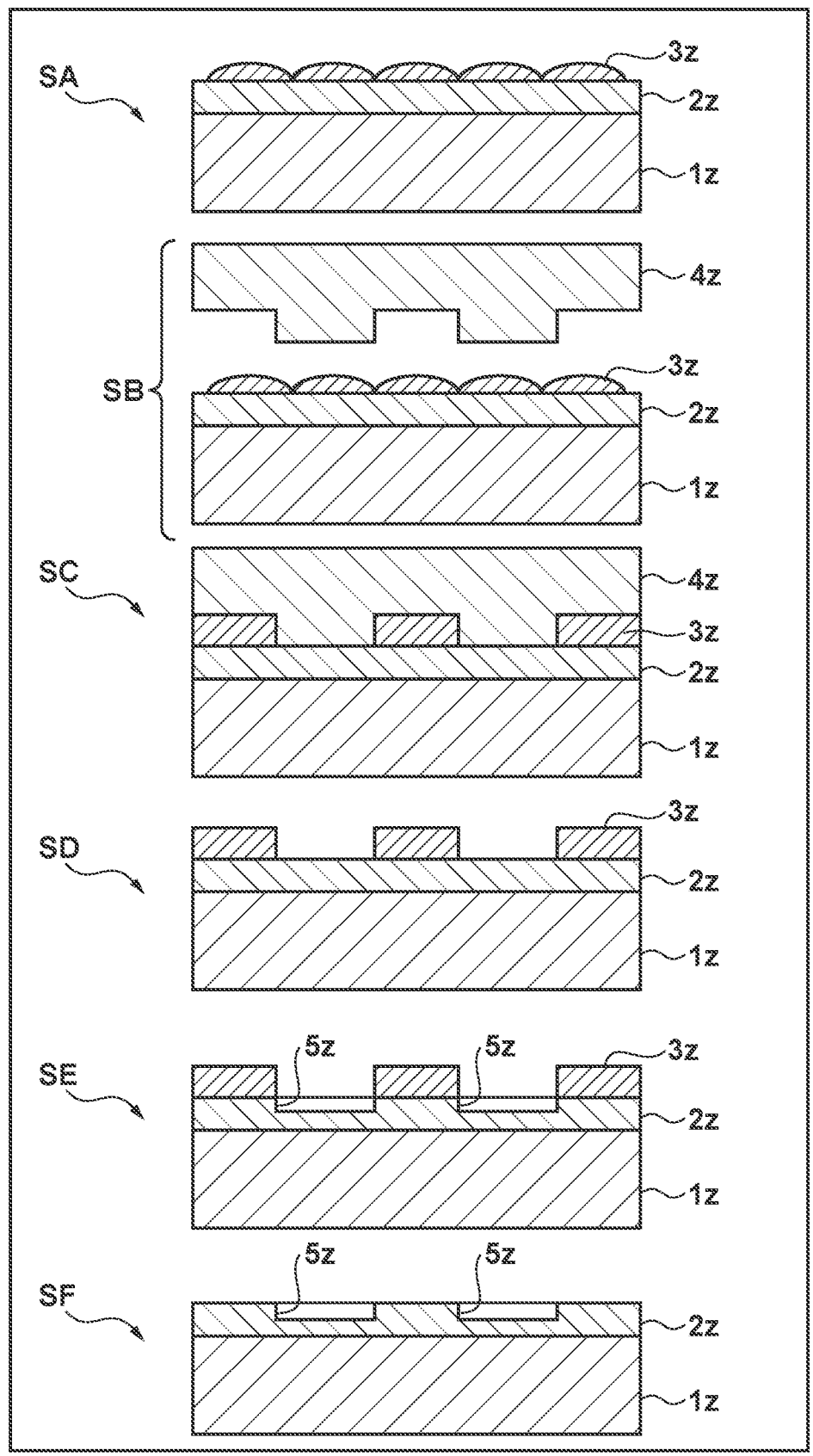
FIG. 12 is a view for explaining an article manufacturing method.

As shown in step SB of FIG. 12, a side of a mold 4z for imprint with an uneven pattern is directed toward and made to face the imprint material 3z on the substrate. As shown in step SC of FIG. 12, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

As shown in step SD of FIG. 12, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

As shown in step SE of FIG. 12, when etching is performed using the pattern of the cured product as an etching resistant mask, a portion of the surface of the processed material 2z where the cured product does not exist or remains thin is removed to form a groove 5z. As shown in step SF of FIG. 12, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-001285, filed Jan. 6, 2022, which is hereby incorporated by reference herein in its entirety.

What is claimed is:

1. An imprint apparatus that performs an imprint process including aligning a substrate and a mold in a state in which the mold is in contact with an imprint material on the substrate and curing the imprint material by light irradiation after the aligning, the apparatus comprising:
   a control unit configured to determine a first exposure amount of a first light irradiation and a second exposure amount of a second light irradiation such that a viscosity resistance of the imprint material in a pattern region of the substrate after the first light irradiation and the second light irradiation does not exceed a first threshold;
   a first irradiation unit configured to perform the first light irradiation of the imprint material on the substrate to incompletely cure the imprint material in the pattern region before bringing the mold into contact with the imprint material on the substrate for the aligning;
   a second irradiation unit configured to perform the second light irradiation of the imprint material on the substrate to further incompletely cure the imprint material in the pattern region, in the aligning; and
   a third irradiation unit configured to perform third light irradiation of the imprint material on the substrate to completely cure the imprint material in the pattern region, in the curing.

2. The apparatus according to claim 1, wherein
the substrate is a substrate on which the imprint material has been supplied to all of a plurality of shot regions in advance in an external apparatus, and
the first irradiation unit is further configured to perform the first light irradiation of the imprint material collectively for all of the plurality of shot regions.

3. The apparatus according to claim 1, wherein
the substrate is a substrate on which the imprint material has been supplied to all of a plurality of shot regions in advance in an external apparatus, and
the first light irradiation is performed by scanning light from the first irradiation unit with respect to the plurality of shot regions.

4. The apparatus according to claim 2, wherein
the imprint process for the substrate and the first light irradiation of an imprint material on another substrate are performed in parallel.

5. The apparatus according to claim 2, wherein the control unit is further configured to control an irradiation amount by the first light irradiation for each shot region in accordance with a film thickness distribution on the substrate.

6. The apparatus according to claim 1, wherein the control unit is further configured to adjust an irradiation amount by the first light irradiation based on data of an evaluation value concerning the aligning of each shot region.

7. The apparatus according to claim 6, wherein
the evaluation value is a magnitude of a vibration component of a relative displacement between the mold and the shot region in the aligning.

8. The apparatus according to claim 6, wherein
the evaluation value is a measurement value of a viscosity resistance force of the imprint material in the aligning.

9. The apparatus according to claim 7, wherein
in a case where a statistic value of the evaluation values for the respective shot regions is larger than a reference value, the control unit is further configured to decrease the irradiation amount by the first light irradiation, and in a case where the statistic value is smaller than the reference value by a predetermined amount or more, the control unit is further configured to increase the irradiation amount by the first light irradiation.

10. The apparatus according to claim 1, further comprising
a substrate positioning unit configured to hold and move the substrate; and
a supply unit configured to supply the imprint material individually onto a plurality of shot regions on the substrate;
wherein, for each sub-region of the substrate, the control unit
is further configured to control the substrate positioning unit and the supply unit such that the imprint material is supplied onto multiple shot regions included in the sub-region, and is further configured to control performance of the imprint process on each of the multiple shot regions included in the sub-region.

11. An imprint method of forming a pattern on a substrate by curing an imprint material by light irradiation in a state in which a mold is in contact with the imprint material on the substrate, the method comprising:
   performing first light irradiation of the imprint material on the substrate to incompletely cure the imprint material in the pattern region before bringing the mold into contact with the imprint material on the substrate;
   performing second light irradiation of the imprint material to further incompletely cure the imprint material in the pattern region, in the state in which the mold is in contact with the imprint material on the substrate;
   aligning the substrate and the mold in a state in which the first light irradiation and the second light irradiation have been performed such that a viscosity resistance of the imprint material in a pattern region of the substrate does not exceed a first threshold; and
   performing third light irradiation of the imprint material to completely cure the imprint material in the pattern region after the aligning of the substrate and the mold.

12. An article manufacturing method comprising:
   forming a pattern on a substrate using an imprint apparatus including:
      a control unit configured to determine a first exposure amount of a first light irradiation and a second exposure amount of a second light irradiation such that a viscosity resistance of the imprint material in a pattern region of the substrate after the first light irradiation and the second light irradiation does not exceed a first threshold;
      a first irradiation unit configured to perform the first light irradiation of the imprint material on the substrate to incompletely cure the imprint material in the pattern region before bringing the mold into contact with the imprint material on the substrate for the aligning;
      a second irradiation unit configured to perform the second light irradiation of the imprint material on the substrate to further incompletely cure the imprint material in the pattern region, in the aligning; and
      a third irradiation unit configured to perform third light irradiation of the imprint material on the substrate to completely cure the imprint material in the pattern region, in the curing; and
   processing the substrate with the pattern formed thereon, wherein an article is manufactured from the processed substrate.

* * * * *